United States Patent
Cho

(10) Patent No.: US 9,658,650 B2
(45) Date of Patent: May 23, 2017

(54) FLEXIBLE DISPLAY

(71) Applicant: Samsung Display Co., Ltd., Yongin-si, Gyeonggi-do (KR)

(72) Inventor: Se Il Cho, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 51 days.

(21) Appl. No.: 14/870,615

(22) Filed: Sep. 30, 2015

(65) Prior Publication Data

US 2016/0270209 A1 Sep. 15, 2016

(30) Foreign Application Priority Data

Mar. 10, 2015 (KR) ........................ 10-2015-0033418

(51) Int. Cl.
| | | |
|---|---|---|
| H05K 1/02 | (2006.01) | |
| H05K 1/18 | (2006.01) | |
| G06F 1/16 | (2006.01) | |
| H01L 51/00 | (2006.01) | |
| H01L 51/52 | (2006.01) | |

(52) U.S. Cl.
CPC ........ *G06F 1/1652* (2013.01); *H01L 51/0097* (2013.01); *H01L 51/5203* (2013.01); *H01L 2251/5338* (2013.01)

(58) Field of Classification Search
CPC ........ G06F 2203/04103; G06F 3/0412; H05K 1/0393; H05K 1/111; H05K 1/117; H05K 1/181; H05K 2201/05; H05K 2201/09045; H05K 2201/09181; H05K 2201/1034; H05K 3/007; H05K 3/3405; H05K 5/0017
See application file for complete search history.

(56) References Cited

U.S. PATENT DOCUMENTS

| | | | | |
|---|---|---|---|---|
| 2008/0094561 | A1* | 4/2008 | Fan .................... | G02F 1/1333 349/151 |
| 2009/0267891 | A1* | 10/2009 | Ali .................... | G06F 1/1626 345/107 |
| 2011/0084290 | A1* | 4/2011 | Nakamura ............ | H01L 27/322 257/89 |
| 2013/0002133 | A1* | 1/2013 | Jin .................... | G09F 9/33 313/511 |

(Continued)

FOREIGN PATENT DOCUMENTS

| | | |
|---|---|---|
| KR | 10-2014-0055607 A | 5/2014 |
| KR | 10-2014-0061897 A | 5/2014 |

(Continued)

*Primary Examiner* — Courtney Smith
*Assistant Examiner* — Michael Matey
(74) *Attorney, Agent, or Firm* — Knobbe, Martens, Olson & Bear, LLP

(57) ABSTRACT

A flexible display is disclosed. In one aspect, the flexible display includes a flexible substrate including a display area, a pad area, and a plurality of chamfer areas formed at opposing ends of the pad area. The flexible display also includes an insulating layer formed over the flexible substrate and a display unit formed over the flexible substrate in the display area. Each of the chamfer areas is adjacent to the display area in a first direction. The insulating layer formed in each of the chamfer areas includes a closed-engraved pattern having a stripe shape extending in a second direction that at least partially crosses the first direction.

20 Claims, 11 Drawing Sheets

(56) References Cited

U.S. PATENT DOCUMENTS

| | | | | |
|---|---|---|---|---|
| 2015/0060778 A1* | 3/2015 | Kim | ............... | H01L 27/3258 257/40 |
| 2015/0060806 A1* | 3/2015 | Park | ............... | H01L 51/5253 257/40 |
| 2015/0187279 A1* | 7/2015 | Lee | ............... | G09G 3/3225 257/40 |
| 2015/0380685 A1* | 12/2015 | Lee | ............... | H01L 51/5243 257/40 |
| 2015/0382446 A1* | 12/2015 | Kwon | ............... | H05K 1/028 174/251 |
| 2016/0093644 A1* | 3/2016 | Ki | ............... | H01L 29/78672 257/40 |
| 2016/0179229 A1* | 6/2016 | Ahn | ............... | G06F 3/041 345/173 |
| 2016/0328051 A1* | 11/2016 | Shishido | ............... | G06F 3/044 |

FOREIGN PATENT DOCUMENTS

| | | |
|---|---|---|
| KR | 10-2014-0120509 A | 10/2014 |
| KR | 10-2015-0015257 A | 2/2015 |

\* cited by examiner

FLEXIBLE DISPLAY

RELATED APPLICATIONS

This application claims priority to and the benefit of Korean Patent Application No. 10-2015-0033418 filed in the Korean Intellectual Property Office on Mar. 10, 2015, the entire contents of which are incorporated herein by reference.

BACKGROUND

Field

The described technology relates generally to a flexible display, and more particularly, to a flexible display that is at least partially bent.

Description of the Related Technology

Recently, organic light-emitting diode (OLED) displays, which are self-emission displays, have been receiving attention. OLED displays do not require a separate light source, such as a backlight, in contrast to traditional displays, like liquid crystal displays (LCDs), and thus, can be manufactured to have thin profiles and to be lightweight. Further, OLED displays have other favorable characteristics such as low power consumption, high luminance, and fast response rates.

OLED displays include a substrate and a matrix of pixels, where each pixel has a circuit that includes a thin film transistor formed on the substrate and an OLED which emits light via a current received from the thin film transistor. OLED displays also include a plurality of insulating layers interposed between electrodes of the thin film transistor. Recently, flexible OLED displays have been under development. Such flexible displays include a flexible substrate, such as a plastic sheet, of which at least a portion can be bent.

The above information disclosed in this Background section is only intended to facilitate the understanding of the background of the described technology and therefore it may contain information that does not form the prior art that is already known in this country to a person of ordinary skill in the art.

SUMMARY OF CERTAIN INVENTIVE ASPECTS

One inventive aspect is a flexible display capable of suppressing cracks from being generated and propagating at a bending region due to external interference when at least a part of a flexible substrate is bent.

Another aspect is a flexible display including: a flexible substrate including a display area, a pad area, and chamfer areas formed at both ends of the pad area; an insulating layer formed on the flexible substrate; and a display unit formed in the display area on the flexible substrate. The chamfer area faces the display area in a first direction, and the insulating layer on the chamfer area includes a closed-engraved pattern having a stripe shape crossing the first direction.

The chamfer area can be bent in a second direction crossing the first direction.

The chamfer area can include a chamfer cut line, and the chamfer cut line can be formed in a straight line inclined to any one side of the flexible substrate. The insulating layer can include a plurality of first dam portions extending parallel to a direction crossing the first direction, and a second dam portion contacting the first dam portions and parallel to the chamfer cut line.

The closed-engraved pattern can be a first engraved pattern and the second dam portion can include a closed second engraved pattern having a stripe shape parallel to the chamfer cut line.

The insulating layer on the chamfer area can include an embossed pattern portion contacting the first dam portions, and a dummy pattern can be formed on the embossed pattern portion. The insulating layer on the chamfer area can include an opening portion for forming a dummy pattern and a third dam portion contacting the first dam portions and surrounding the opening portion.

The chamfer cut line can include a first cut line parallel to any one side of the flexible substrate and a second cut line crossing the first cut line. The insulating layer can include a plurality of first dam portions extending parallel to a direction crossing the first direction, and a second dam portion contacting the first dam portions, and at least a part of the second dam portion can be formed to be parallel to the edge of the chamfer area including the chamfer cut line.

The closed-engraved pattern can be a first engraved pattern and the second dam portion can include a closed second engraved pattern elongated along the edge of the chamfer area. The second engraved pattern can include a first linear portion parallel to the first cut line, a second linear portion parallel with the second cut line, and a curved portion connecting the first linear portion and the second linear portion.

The insulating layer on the chamfer area can include an embossed pattern portion contacting the first dam portions, and a dummy pattern can be formed on the embossed pattern portion. The insulating layer on the chamfer area can include an opening portion for forming a dummy pattern and a third dam portion contacting the first dam portions and surrounding the opening portion.

The insulating layer can include at least one of a buffer layer, a gate insulating layer, and an interlayer insulating layer. The closed-engraved pattern can be formed on at least one of the buffer layer, the gate insulating layer, and the interlayer insulating layer.

The display unit can include an OLED, and the flexible display can further include a driver formed on the pad area on the flexible substrate. The flexible display can further include a cover window covering the flexible substrate. The cover window can include a bending area covering the chamfer area.

Another aspect is a flexible display comprising a flexible substrate including a display area, a pad area, and a plurality of chamfer areas formed at opposing ends of the pad area; an insulating layer formed over the flexible substrate; and a display unit formed over the flexible substrate in the display area, wherein each of the chamfer areas is adjacent to the display area in a first direction, and wherein the insulating layer formed in each of the chamfer areas includes a closed-engraved pattern having a stripe shape extending in a second direction that at least partially crosses the first direction.

In exemplary embodiments, each of the chamfer areas is bent in a second direction crossing the first direction. Each of the chamfer areas can include a chamfer cut line, and each of the chamfer cut lines can be formed as a straight line inclined with respect to at least one side of the flexible substrate. The insulating layer formed in each of the chamfer areas can comprise a plurality of first barriers extending parallel to the second direction, and a second barrier contacting the first barriers and extending parallel to the chamfer cut line.

In exemplary embodiments, the closed-engraved pattern is a first engraved pattern, and the second barrier includes a closed second engraved pattern having a stripe shape parallel to the chamfer cut line. The insulating layer formed in the chamfer area can include an embossed pattern contacting the first barriers, and a dummy pattern can be formed on the embossed pattern. The insulating layer formed in each of the chamfer areas can comprise: i) an opening in which a dummy pattern is formed and ii) a third barrier contacting the first barriers and surrounding the opening.

In exemplary embodiments, each of the chamfer areas includes a chamfer cut line, and each of the chamfer cut lines includes a first cut line parallel to at least one side of the flexible substrate and a second cut line crossing the first cut line. The insulating layer formed in each of the chamfer areas can comprise a plurality of first barriers extending parallel to the second direction, and a second barrier contacting the first barriers, and at least a portion of the second barrier is formed parallel to an edge of the chamfer area including the chamfer cut line. The closed-engraved pattern can be a first engraved pattern, and the second barrier can include a closed second engraved pattern elongated along the edge of the chamfer area.

In exemplary embodiments, the second engraved pattern comprises a first linear portion parallel to the first cut line, a second linear portion parallel to the second cut line, and a curved portion connecting the first linear portion and the second linear portion. The insulating layer formed in each of the chamfer areas can include an embossed pattern contacting the first barriers, and a dummy pattern can be formed on the embossed pattern. The insulating layer formed in each of the chamfer areas can comprise: i) an opening in which a dummy pattern is formed and ii) a third barrier contacting the first barriers and surrounding the opening.

In exemplary embodiments, the insulating layer includes at least one of a buffer layer, a gate insulating layer, and an interlayer insulating layer, and the closed-engraved pattern is formed in at least one of the buffer layer, the gate insulating layer, and the interlayer insulating layer. The display unit can further comprise at least one organic light-emitting diode (OLED) and the flexible display can further comprise a driver formed on the flexible substrate in the pad area. The flexible display can further comprise a cover window covering the flexible substrate. The cover window can include a curved portion covering the chamfer areas.

Another aspect is a flexible display comprising a flexible substrate including a display area and a non-display area surrounding the display area, wherein the display area includes a plurality of pixels, wherein the non-display area includes: i) a pad area formed on one side of the display area and ii) a pair of chamfer areas formed on opposing sides of the pad area; an insulating layer formed over the flexible substrate; and a rigid cover window including a flat area and a pair of curved areas formed on opposing sides of the flat area, wherein the flexible substrate is attached to the cover window such that the chamfer areas are respectively bent along the curved areas of the cover window, and wherein the insulating layer formed in each of the chamfer areas is engraved to form a pattern having a stripe shape.

In exemplary embodiments, each of the chamfer areas is adjacent to the display area in a first direction and the stripe shape of each of the patterns at least partially extends in a second direction crossing the first direction. Each of the chamfer areas can includes a chamfer cut line, and each of the chamfer cut lines can be formed as a straight line inclined with respect to at least one side of the flexible substrate.

According to at least one exemplary embodiment, it is possible to minimize cracks from being generated on an insulating layer by reducing interference with a cover window by forming chamfer areas at both ends of a pad area and prevent cracks from being generated and propagated in the insulating layer due to bending by forming a closed-engraved pattern on the insulating layer on the chamfer area.

DETAILED DESCRIPTION OF CERTAIN INVENTIVE EMBODIMENTS

Figure 1:
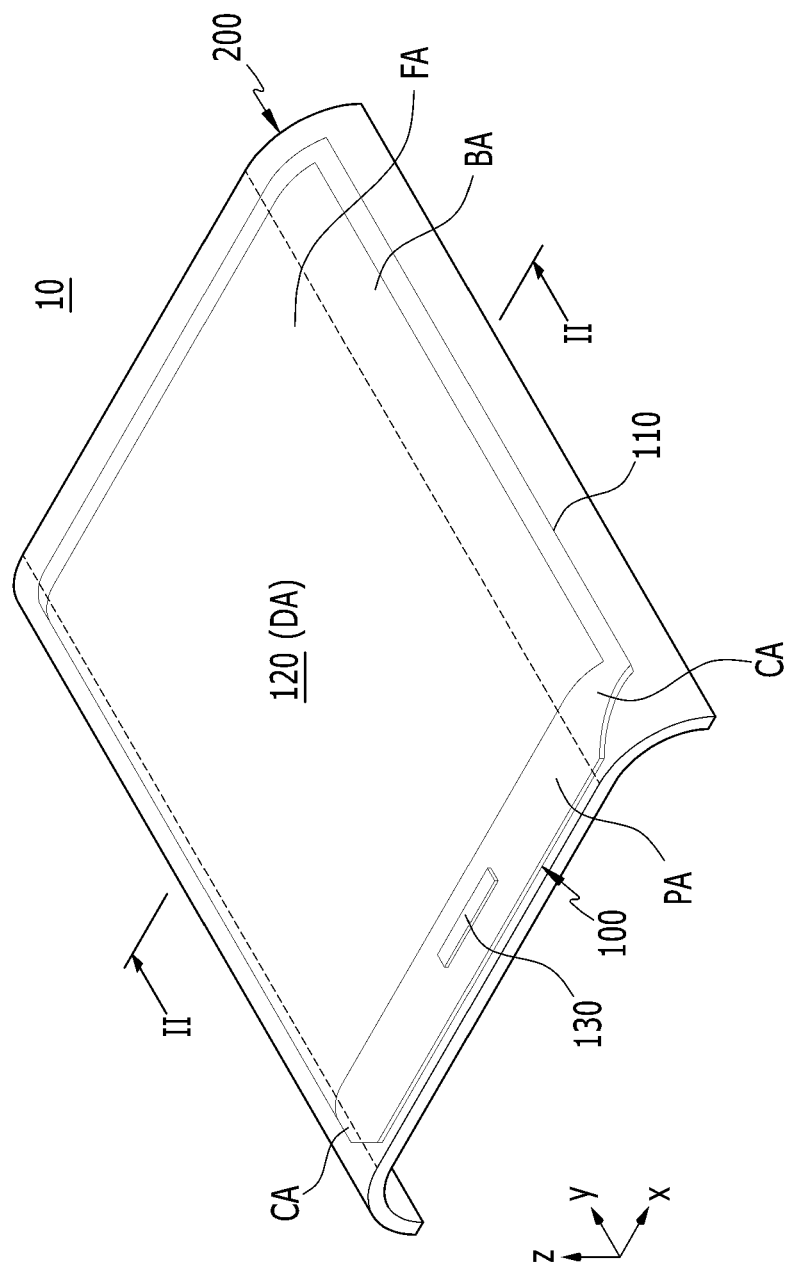
FIG. 1 is a perspective view of a flexible display according to a first exemplary embodiment.

Hereinafter, exemplary embodiments will be described in detail with reference to the accompanying drawings so that those skilled in the technical field to which the present disclosure pertains may carry out the exemplary embodiments. As those skilled in the art would realize, the described embodiments may be modified in various different ways, all without departing from the spirit or scope of the present disclosure.

It will be understood that when an element such as a layer, film, region, or substrate is referred to as being "on" another element, it can be directly on the other element or intervening elements may also be present. Further, in the specification, the word "on" means positioning on or below an object, but does not essentially mean positioning on the upper side of the object based on the illustrated orientation of the object with respect to the direction of gravity.

Throughout the specification and the claims, unless explicitly described to the contrary, the word "comprise" and variations such as "comprises" or "comprising" will be understood to imply the inclusion of stated elements but not the exclusion of any other elements. In addition, the sizes and thicknesses of the elements shown in the drawings may be exaggerated for the sake of clarity, but the present disclosure is not limited thereto.

Figure 2:
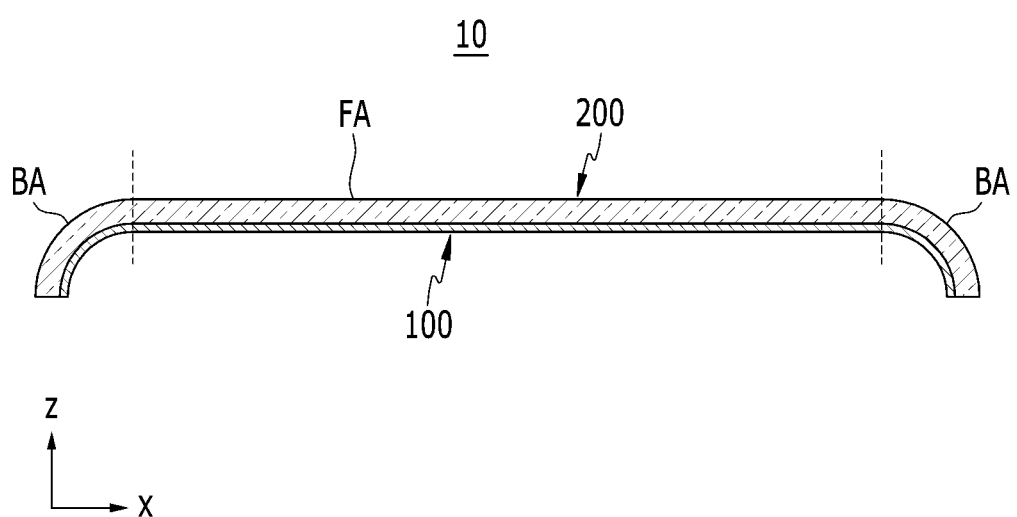
FIG. 2 is a cross-sectional view of the flexible display taken along line II-II of FIG. 1.

FIG. 1 is a perspective view of a flexible display according to first exemplary embodiment. FIG. 2 is a cross-sectional view of the flexible display taken along line II-II of FIG. 1.

Referring to FIGS. 1 and 2, the flexible display 10 of the first exemplary embodiment includes a flexible display panel 100 and a cover window 200, and at least a portion of the flexible display 10 is bent with a predetermined curvature.

The flexible display panel 100 includes a flexible substrate 110 and a display unit 120 and a driver 130 formed on the flexible substrate 110. The flexible display panel 100 can display a predetermined image by emitting light via pixels included in the display unit 120.

The cover window 200 covers the flexible display panel 100. The cover window 200 can be formed of glass or a rigid transparent resin, and protects the flexible display panel 100 from external impact and scratches. The flexible display panel 100 is fixed to the inside of the cover window 200 to maintain the same shape as the cover window 200.

A touch screen panel (not illustrated) that can function as a touch sensor, a polarization film (not illustrated) for reducing reflection of external light, and the like can be positioned between the flexible display panel 100 and the cover window 200.

At least a portion of the flexible display 10 is bent with a predetermined curvature. That is, the flexible display 10 includes a curved area (alternatively, a bending area) BA. For example, the flexible display 10 can include a flat area FA, and two bending areas BA positioned on opposing sides of the flat area FA. The two bending areas BA can be formed to have substantially the same width and the same curvature.

Figure 3:
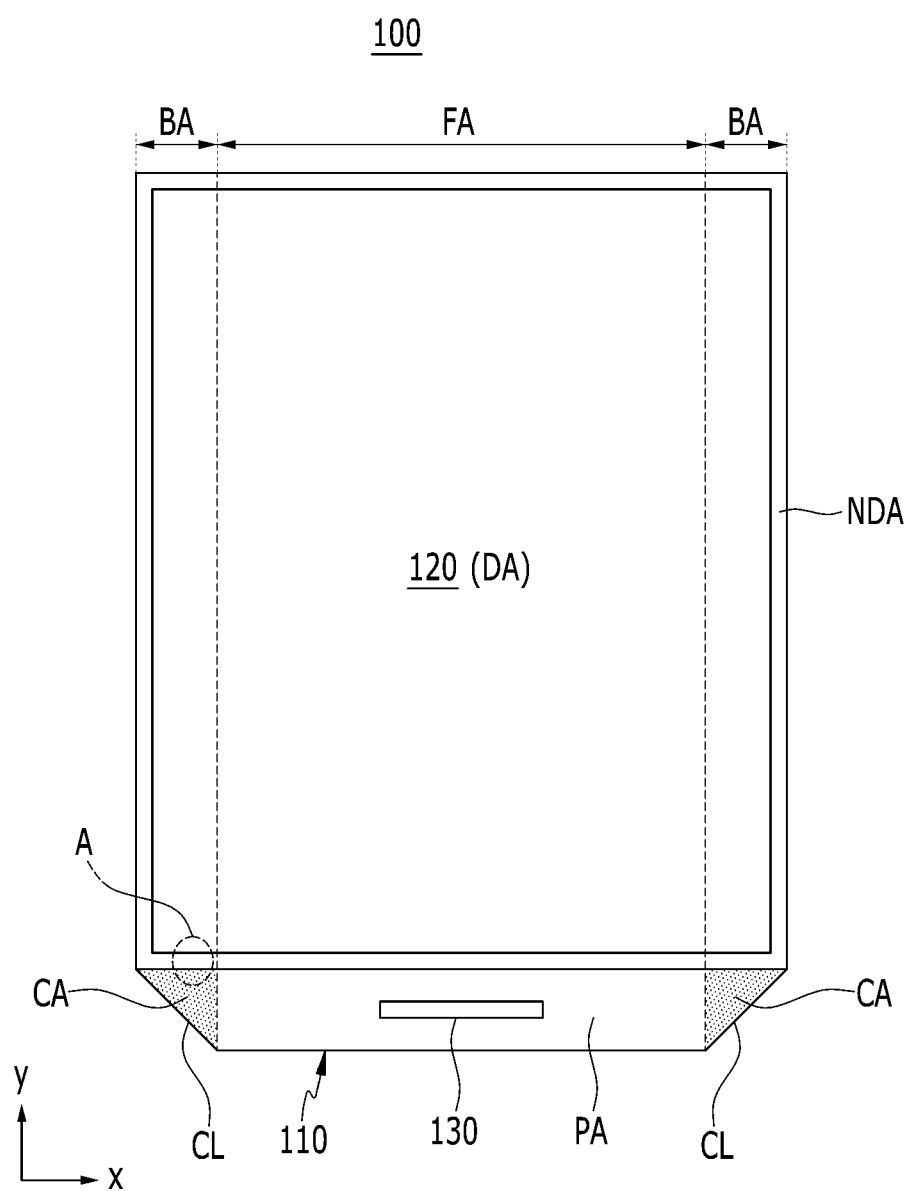
FIG. 3 is a plan view of the flexible display panel illustrated in FIG. 1.
Figure 4:
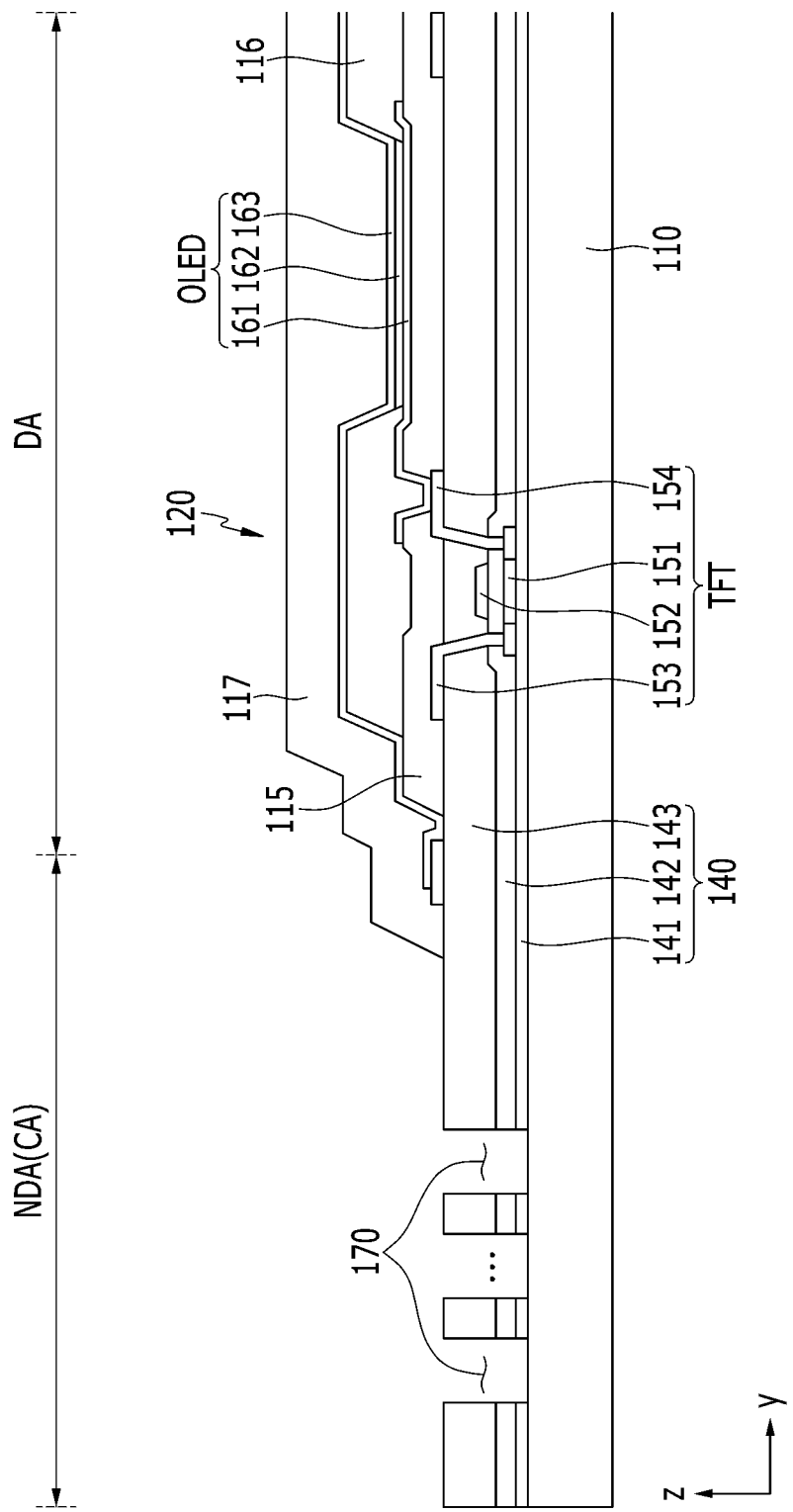
FIG. 4 is an enlarged cross-sectional view of an area A illustrated in FIG. 3.

FIG. 3 is a plan view of a flexible display panel illustrated in FIG. 1. FIG. 4 is an enlarged cross-sectional view of a part A illustrated in FIG. 3. The flexible display panel 100 comprises the flat area FA and two bending areas BA, but in FIG. 3, for convenience, it is assumed and illustrated that the entire flexible display panel is in a flat configuration.

Referring to FIGS. 3 and 4, the flexible display panel 100 includes a flexible substrate 110 including a display area DA and a non-display area NDA, an insulating layer 140 formed on the flexible substrate 110, a display unit 120 formed in the display area DA on the flexible substrate 110, and a driver 130 formed in the non-display area NDA on the flexible substrate 110. The driver 130 is electrically connected to the display unit 120 by a plurality of wires.

The flexible substrate 110 can be formed of an organic material including at least one of polyimide, polycarbonate, polyethylene, polyethylene terephthalate, and polyacrylate. The flexible substrate 110 can be bent and can have a light transmittance greater than a threshold value.

The insulating layer 140 is formed in both the display area DA and the non-display area NDA of the flexible substrate 110, and for example, can be formed to have the same size as the flexible substrate 110. The insulating layer 140 can include a buffer layer 141, a gate insulating layer 142, and an interlayer insulating layer 143. The buffer layer 141, the gate insulating layer 142, and the interlayer insulating layer 143 can be formed of an inorganic material including at least one of silicon nitride (SiNx), silicon oxide ($SiO_2$), alumina ($Al_2O_3$), and titanium oxide ($TiO_2$).

The insulating layer 140 is a layer formed in a process of forming the display unit 120, particularly, a process of forming a driving circuit unit or pixel circuit of the display unit 120. The number of layers included in the insulating layer 140 is not limited to the aforementioned example, and an additional layer such as a barrier layer (not illustrated) that can prevent oxygen and moisture from permeating below the buffer layer 141 can also be included.

The display unit 120 includes a plurality of pixels, and a driving circuit unit and an OLED are formed in each pixel. The driving circuit unit includes a switching thin film transistor, a driving thin film transistor, and a storage capacitor. In FIG. 4, for convenience, the switching thin film transistor and the storage capacitor are not illustrated. The driving thin film transistor TFT includes a semiconductor layer 151, a gate electrode 152, a source electrode 153, and a drain electrode 154.

A buffer layer 141 is formed below the semiconductor layer 151. The buffer layer 141 provides a flat surface on which the driving circuit unit can be formed and prevents moisture and foreign substances from permeating to the driving circuit unit.

The semiconductor layer 151 is formed of polysilicon or an oxide semiconductor, and includes a channel region in which impurities are not doped (i.e., an undoped region) and a source region and a drain region in which impurities are doped (i.e., a doped region). The semiconductor layer 151 formed of the oxide semiconductor can be covered by a separate passivation layer. The semiconductor layer 151 is covered by the gate insulating layer 142 and a gate electrode 152 is formed on the gate insulating layer 142. The gate electrode 152 overlaps the channel region of the semiconductor layer 151 and is covered by the interlayer insulating layer 143.

The source electrode 153 and the drain electrode 154 are formed on the interlayer insulating layer 143. The source electrode 153 and the drain electrode 154 are connected to the source region and the drain region of the semiconductor layer 151 through a via hole formed in the interlayer insulating layer 143 and the gate insulating layer 142.

The driving thin film transistor TFT is covered by a planarization layer 115 and connected to the OLED to drive the OLED. The planarization layer 115 can be formed only in the display area DA. The OLED includes a pixel electrode 161, an emission layer 162, and a common electrode 163.

The pixel electrode 161 is formed on the planarization layer 115 for each pixel. The pixel electrode 161 is connected to the drain electrode 154 of the driving thin film transistor TFT through a via hole formed in the planarization layer 115. A pixel defining layer 116 is formed on the planarization layer 115 and an edge of the pixel electrode 161. The emission layer 162 is formed on the pixel electrode 161, and the common electrode 163 can be formed in the entire display area DA without being divided for each pixel.

Any one of the pixel electrode 161 and the common electrode 163 injects hole(s) into the emission layer 162 and the other electrode 161 or 163 injects electron(s) into the emission layer 162. The hole(s) and the electron(s) are recombined with each other in the emission layer 162 to generate excitons(s), and light is emitted by energy generated when the excitons(s) falls from an excited state to a ground state.

The pixel electrode 161 can be formed of a reflective film and the common electrode 163 can be formed of a transparent film or a transflective film. The light emitted from the emission layer 162 is reflected from the pixel electrode 161 and passes through the common electrode 163 to be emitted to the environment. When the common electrode 163 is formed of the transflective layer, a portion of the light reflected from the pixel electrode 161 is re-reflected from the common electrode 163 to form a resonance structure and enhance light extraction efficiency of the OLED.

The display unit 120 further includes an encapsulation portion 117. The encapsulation portion or encapsulation layer 117 encapsulates the OLED to suppress deterioration of the OLED due to moisture and oxygen which could otherwise penetrate to the OLED from the environment. The encapsulation portion 117 is formed by a laminated structure of an inorganic layer and an organic layer, and includes at least a first inorganic layer, a first organic layer, and a second inorganic layer.

The display area DA is positioned in a central region of the flexible substrate 110, and the non-display area NDA surrounds the display area DA. The non-display area NDA includes a pad area PA formed on at least one side of the display area DA and chamfer areas CA formed on opposing sides of the pad area PA. The pad area PA and the chamfer areas CA can be adjacent to the display area DA in a first direction (a y-axial direction), and the chamfer area CA can be adjacent to the pad area PA in a second direction (an x-axial direction) crossing the first direction.

The driver 130 is formed in the pad area PA above the flexible substrate 110 and electrically connected to the driving circuit unit of the display unit 120. The driver 130 can be provided in a chip-on-film form and function as any one of a scan driver and/or a data driver.

The chamfer area CA is formed by cutting edges of the flexible substrate 110 having an initial quadrangular shape, and in particular, by cutting edges of the pad area PA before forming the bending area BA. That is, the chamfer area CA is defined as an area positioned at ends of the pad area PA while contacting a chamfer cut line CL. In FIG. 3, the chamfer area CA is illustrated as being hatched with a dot pattern.

The chamfer cut line CL of the chamfer area CA can be a straight line extending in an oblique direction and can be formed at a predetermined angle with a long side and a short side of the flexible substrate 110. The insulating layer 140 is formed in both the display area DA and the non-display area NDA, and the insulating layer 140 on the non-display area NDA is exposed to the environment.

The manufacturing process of the flexible display 10 can include positioning the flexible display panel 100 on a support pad (not illustrated) including the flat area FA and the bending area BA, forming the cover window 200 on the flexible display panel 100 and then pressing the cover window 200 downward. A transparent adhesive layer can be positioned between the flexible display panel 100 and the cover window 200.

The flexible substrate 110 includes the chamfer area CA, and as a result, in an assembling process with the cover window 200, cracks in the insulating layer 140 caused due to interference with the cover window 200 can be suppressed from being generated.

In detail, the flexible display panel 100 can be placed on the support pad while the edges of the flexible display panel 100 corresponding to the bending area of the support pad do not contact the support pad. When the entire flexible display panel 100 has a quadrangular shape without the chamfer area and the cover window 200 is pressed onto the flexible display panel 100, the ends of the pad area PA contact the inner edge of the cover window 200 and may be dented due to the contact.

The portion of the pad area PA dented by the inner edge of the cover window 200 in the flexible display panel 100 forms a surface of the insulating layer formed at the ends of the pad area. Accordingly, cracks can be generated in the insulating layer 140 due to interference with the cover window 200.

Further, since the edges of the flexible substrate 110 are bent with a predetermined curvature, the cracks generated in the insulating layer 140 may be easily propagated to the pad area and the display area due to the bending stress. The crack(s) propagated to the pad area may cause damage to the driver 130, and the crack(s) propagated to the display area may cause damage to the driving circuit unit. Further, external moisture and oxygen can permeate into the OLED through the crack propagated to the display area, thereby causing the OLED to deteriorate.

However, in the flexible display 10 of the first exemplary embodiment, the flexible substrate 110 can reduce interference with the cover window 200 by removing the portion of the pad area PA which causes interference with the cover window 200, that is, ends of the pad area PA can be removed by forming the chamfer area CA. As a result, the generation of the cracks of the insulating layer 140 can be minimized, and the driver 130 and the display unit 120 can be prevented from being damaged and deteriorated due to the propagation of crack(s).

Furthermore, in the flexible display 10 of the first exemplary embodiment, a plurality of engraved patterns can be formed on the insulating layer 140 in the non-display area NDA to actively prevent the cracks of the insulating layer 140 from being propagated by bending stress.

Figure 5:
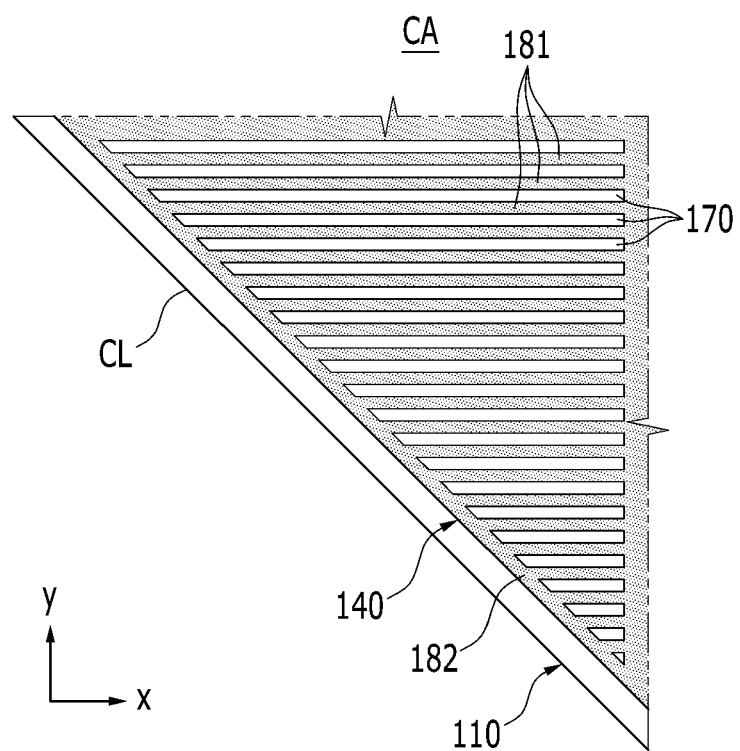
FIG. 5 is a plan view of a chamfer area of the flexible display panel illustrated in FIG. 4.

FIG. 5 is a plan view of a chamfer area of the flexible display panel illustrated in FIG. 4. In FIG. 5, for convenience, it is assumed and illustrated that the chamfer area is flat.

Referring to FIGS. 3 and 5, the chamfer area CA is formed in the bending area BA and can be bent in a second direction (x-axial direction). The insulating layer 140 formed in the chamfer area CA is also bent in the second direction and includes an engraved pattern 170 for reducing the stress caused when the chamfer area CA is bent.

In the FIG. 5 embodiment, the insulating layer 140 formed in the chamfer area CA can be spaced apart from the chamfer cut line CL by a predetermined distance. That is, the insulating layer 140 formed in the chamfer area CA can be formed within a predetermined distance from the chamfer cut line CL. When the chamfer area CA is formed by cutting the flexible substrate 110 by a cutting knife or the like, the crack(s) formed in the insulating layer 140 can be prevented from being generated due to stresses generated during cutting.

In the insulating layer 140 formed in the chamfer area CA, a closed-engraved pattern 170 having a stripe shape is formed which crosses a direction facing the display area DA from the chamfer cut line CL, that is, the first direction (y-axial direction in which the chamfer area CA and the display area DA face each other). The engraved pattern 170 is a region in which a portion of the insulating layer 140 is removed and can be referred to as an opening, an opening pattern, a hole, a slit, or the like.

In addition, the engraved pattern 170 can be a "closed type" pattern, which means that the engraved pattern 170 is completely surrounded by the insulating layer 140 when the chamfer area CA is viewed from above. That is, the closed-engraved pattern 170 is not opened to the edge of the flexible substrate 110, for example, the chamfer cut line CL, but is completely surrounded by the insulating layer 140.

The engraved pattern 170 formed in the insulating layer 140 has a stripe shape extending parallel to the direction (x-axial direction) crossing the first direction. A plurality of engraved patterns 170 can be formed with substantially the same width and can be formed at a regular interval. An end of each engraved pattern 170 facing the chamfer cut line CL can be formed by an oblique line parallel to the chamfer cut line CL.

The insulating layer 140 includes a plurality of first dam portions or first barriers 181 extending parallel to a direction crossing the first direction by the aforementioned engraved pattern 170 and a second dam portion or second barrier 182 contacting the first dam portions 181 and parallel to the chamfer cut line CL. The second dam portion 182 is formed between the chamfer cut line CL and the engraved pattern 170 to prevent the engraved pattern 170 from being opened to the chamfer cut line CL. The first dam portion 181 and the second dam portion 182 are integrally formed without be disconnected.

Due to the aforementioned engraved pattern 170 formed in the chamfer area CA, the first dam portions 181 and the engraved patterns 170 are alternately arranged in the first direction. That is, the insulating layer 140 is not elongated in the first direction facing the display area DA from the chamfer area CA but is disconnected by the engraved pattern 170.

Accordingly, even when cracks are generated in the insulating layer 140 in the chamfer area CA due to impact applied to the chamfer cut line CL, impact applied to the chamfer area CA due to interference with the cover window 200, bending stress in the insulating layer 140, or the like, the cracks can be prevented from being propagated in the first direction facing the display area DA from the chamfer area CA. In other words, since the first dam portion 181 is disconnected in the propagation direction (first direction) of the crack facing the display area DA from the chamfer area CA, the propagation of cracks can be prevented.

Further, the second dam portion 182 is parallel to the chamfer cut line CL and connected to the first dam portions 181 to be integrally formed therewith. Thus, when the chamfer area CA is bent, the stress of the insulating layer 140 can be reduced. That is, the insulating layer 140 including the second dam portion 182 has an excellent effect of reducing stress when compared to an insulating layer (an insulating layer including an opened-engraved pattern) without the second dam portion 182 and can prevent the cracks in the insulating layer 140 from being generated and propagated due to bending of the insulating layer 140.

The engraved pattern 170 of the insulating layer 140 can be formed in all of a plurality of inorganic layers included in the insulating layer 140 (a barrier layer, a buffer layer, a gate insulating layer, an interlayer insulating layer, and the like) or selectively formed in at least one of the inorganic layers.

Figure 6:
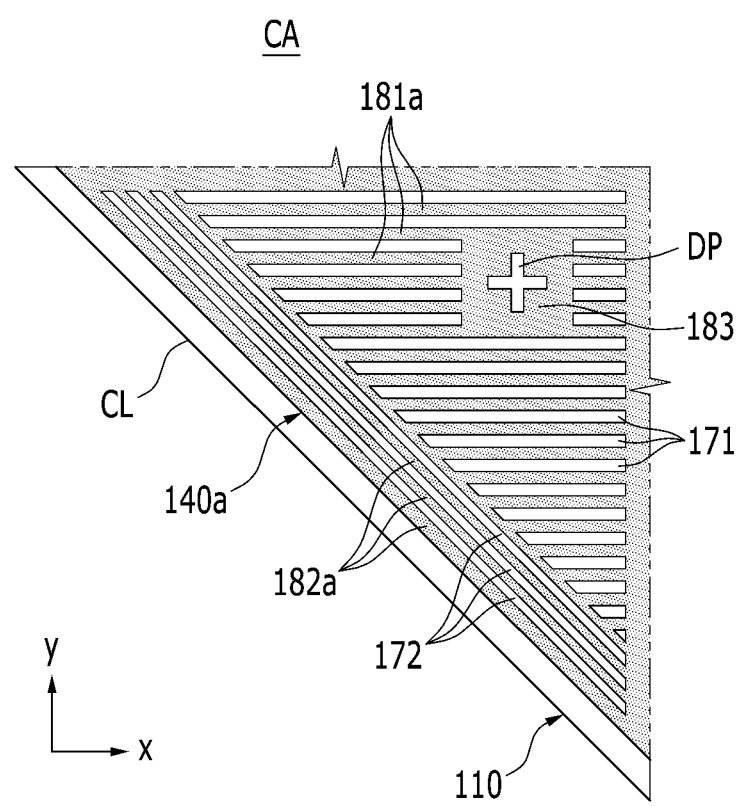
FIG. 6 is a plan view of a chamfer area of a flexible display according to a second exemplary embodiment.

FIG. 6 is a plan view of a chamfer area of a flexible display according to a second exemplary embodiment.

Referring to FIG. 6, in an insulating layer 140a formed in the chamfer area CA, a first engraved pattern 171 which is a closed-engraved pattern having a stripe shape crossing the first direction (y-axial direction), and a second engraved pattern 172 which is a closed-engraved pattern having a stripe pattern parallel to the chamfer cut line CL are formed.

The insulating layer 140a includes a plurality of first dam portions 181a extending parallel to a direction (x-axial direction) crossing the first direction by the aforementioned engraved patterns 171 and 172 and a plurality of second dam portions 182a extending parallel to an oblique direction parallel to the chamfer cut line CL. The second dam portion 182a which is positioned farthest away from the chamfer cut line CL is connected to the first dam portions 181a to be integrally formed therewith. All of the first dam portions 181a and the second dam portions 182a are connected with each other without being disconnected.

Due to the inclusion of the second dam portions 182a when the chamfer area CA is bent, the generation of cracks can be prevented by reducing stress at the insulating layer 140 portion close to the chamfer cut line CL.

Meanwhile, in the flexible display of the first exemplary embodiment or the second exemplary embodiment, in the chamfer area CA, a dummy pattern DP such as an alignment mark for verifying alignment with other components or various test marks for measuring resistance can be formed. The dummy pattern DP can be formed of a metal layer and can be formed to have various shapes such as a cross shape.

The insulating layer 140a in the chamfer area CA includes an embossed pattern portion 183, and the dummy pattern DP can be formed on the embossed pattern portion 183. The embossed pattern portion 183 is integrally connected with the first dam portions 181 to prevent a disconnected portion from being generated in the insulating layer 140.

When the flexible substrate is exposed by removing a portion of the first dam portion in order to form the dummy pattern, the first dam portion has a disconnected end. When the insulating layer has the disconnected portion, the disconnected portion may act as the origin of crack(s). However, in the present exemplary embodiment, since the insulating layer 140a does not include a disconnected portion, the crack can be prevented from being generated.

In the flexible display of the second exemplary embodiment, other configurations except for the second dam portions 182a and the embossed pattern portion 183 are the same as those of the aforementioned first exemplary embodiment.

Figure 7:
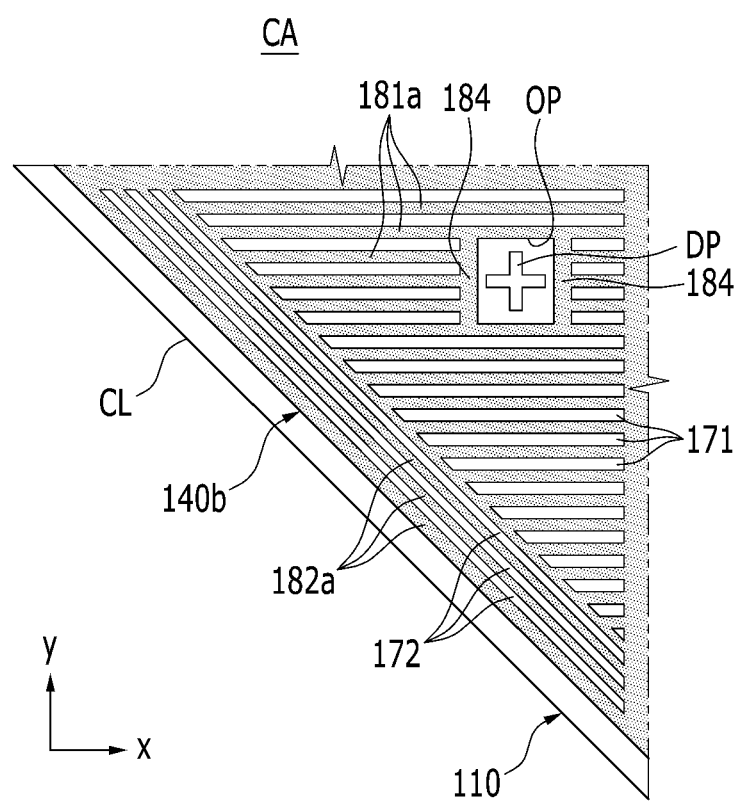
FIG. 7 is a plan view of a chamfer area of a flexible display according to a third exemplary embodiment.

FIG. 7 is a plan view of a chamfer area of a flexible display according to a third exemplary embodiment.

Referring to FIG. 7, an insulating layer 140b formed in the chamfer area CA has an opening portion OP for forming the dummy pattern DP and includes a third dam portion 184 surrounding the opening portion OP. The dummy pattern DP is formed on the surface of the flexible substrate 110 exposed by the opening portion OP.

A portion of the third dam portion 184 contacts the first dam portions 181a to prevent the first engraved pattern 171 from being opened toward the opening portion OP. The other portion of the third dam portion 184 may belong to the first dam portion 181a. That is, a portion of the first dam portion 181a can serve as the third dam portion 184. The insulating layer 140b including the third dam portion 184 does not include the disconnected portion and thus can prevent cracks from being generated.

In the flexible display of the third exemplary embodiment, other configurations except for the opening OP and the third dam portion 184 are the same as the aforementioned second exemplary embodiment.

Figure 8:
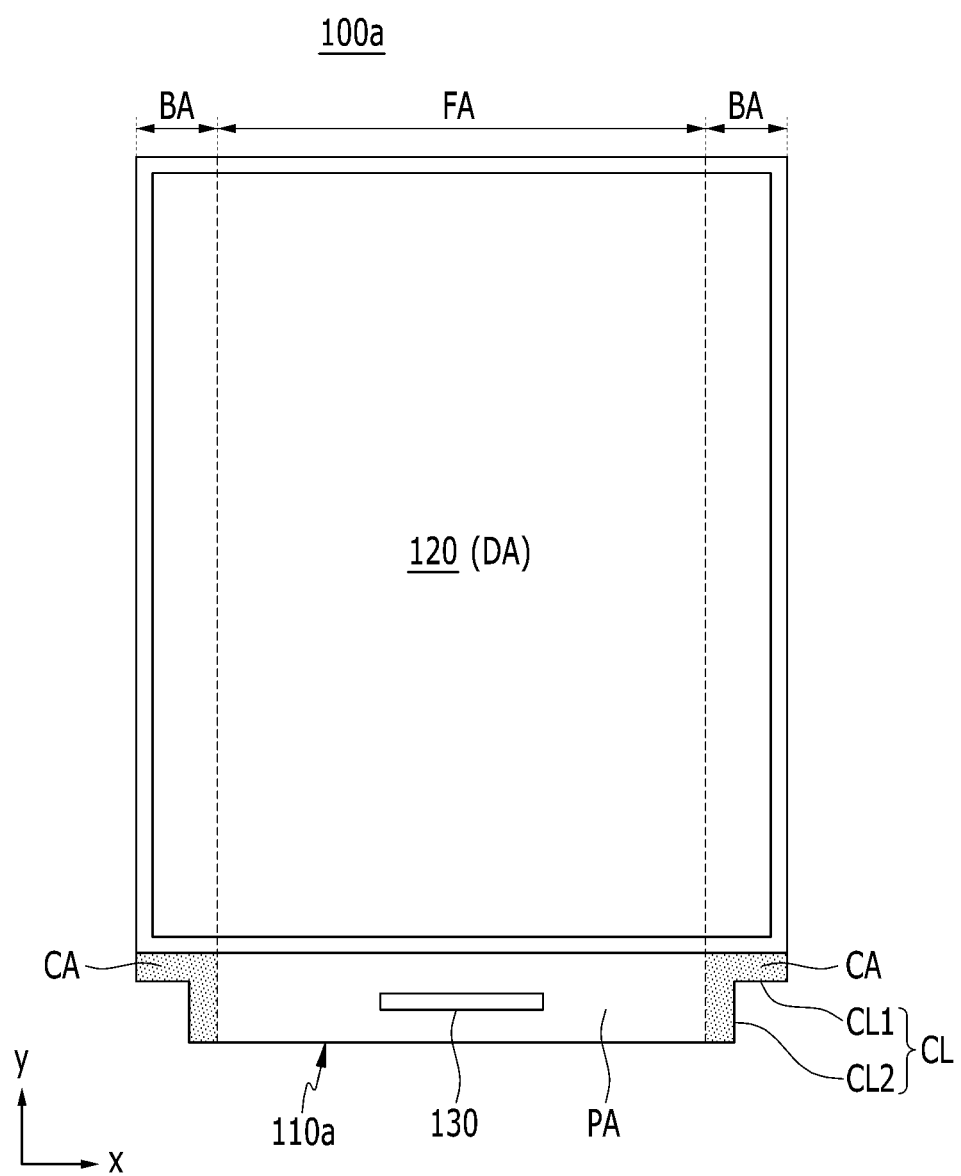
FIG. 8 is a plan view of a flexible display panel of a flexible display according to a fourth exemplary embodiment.
Figure 9:
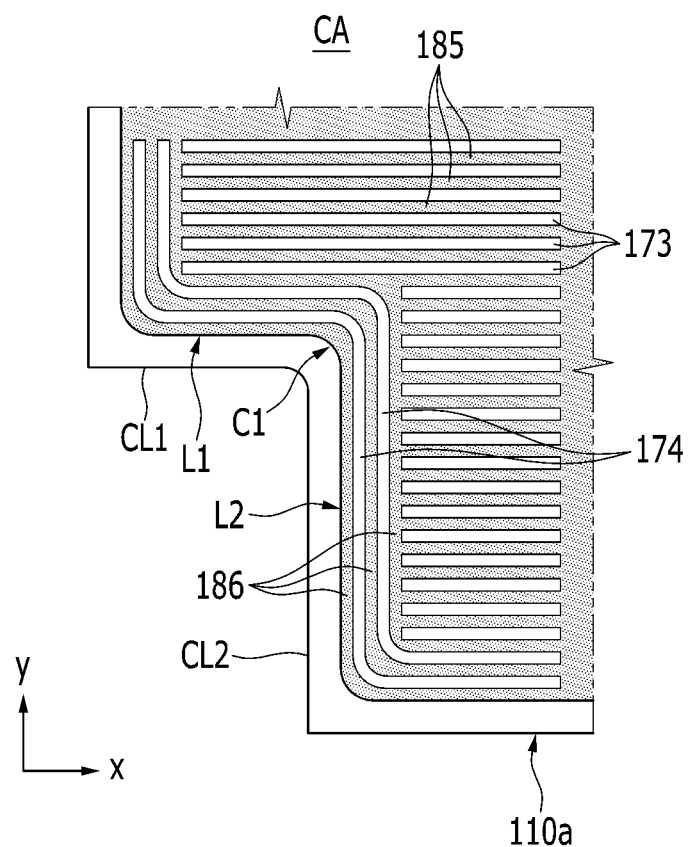
FIG. 9 is an enlarged view of a chamfer area of the flexible display panel illustrated in FIG. 8.

FIG. 8 is a plan view illustrating a flexible display panel of a flexible display according to a fourth exemplary embodiment. FIG. 9 is an enlarged view of a chamfer area of the flexible display panel illustrated in FIG. 8. The flexible display panel 100a illustrated in FIG. 8 includes a flat area FA and two bending area BA similar to the first exemplary embodiment. Further, the flexible display panel 100a is illustrated by assuming that the flexible display panel 100a is flat for ease of description and illustration in FIGS. 8 and 9.

Referring to FIGS. 8 and 9, a chamfer cut line CL of the flexible substrate 110a includes two straight lines. In detail, the chamfer cut line CL can include a first cut line CL1 parallel to a short side of the flexible substrate 110a and a second cut line CL2 parallel to a long side of the flexible substrate 110a. The chamfer cut line CL can have a substantially L shape.

A closed first engraved pattern 173 having a stripe shape crossing a first direction (y-axis direction) is formed in an insulating layer 140c above a chamfer area CA. The insulating layer 140c includes a plurality of first dam portions 185 that extend in line in a direction (x-axis direction)

crossing the first direction and second dam portions 186 of which at least a portion is parallel to an edge of the chamfer area CA while contacting the first dam portions 185.

A closed second engraved pattern 174 that is elongated along the edge of the chamfer area CA can be formed in the second dam portion 186. The second engraved pattern 174 can include a first straight line portion L1 parallel to a first cut line CL1, a second straight line portion L2 parallel to the second cut line CL2, and a curved portion C1 connecting the first straight line portion L1 and the second straight line portion L2. The curved portion C1 serves to suppress a crack from being generated by distributing stress of the insulating layer 140c.

The first dam portions 185 and the second dam portions 186 are all integrally connected without being disconnected. Since the first dam portion 185 and the first engraved pattern 173 are alternatively positioned in the first direction (y-axis direction) toward a display part DP from the chamfer cut line CL, crack propagation in the insulating layer 140c can be interrupted. Further, as a second dam portion 186 is positioned inside the chamber cut line CL, the generation of the crack can be prevented by reducing the stress at the insulating layer 140c portion close to the chamfer cut line CL.

The remaining components other than the chamfer area CA in the flexible display of the fourth exemplary embodiment are the same as those of the first exemplary embodiment.

Figure 10:
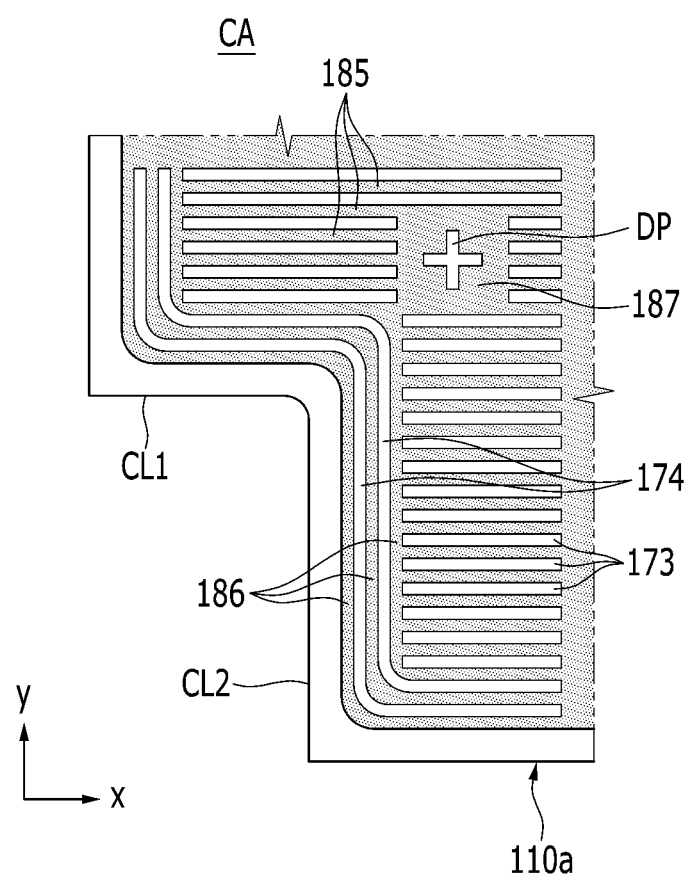
FIG. 10 is a plan view of a chamfer area of a flexible display according to a fifth exemplary embodiment.

FIG. 10 is a plan view of a chamfer area of a flexible display according to a fifth exemplary embodiment.

Referring to FIG. 10, an insulating layer 140d above the chamfer area CA includes an embossed pattern portion 187 and a dummy pattern DP is formed above the embossed pattern portion 187. The embossed pattern portion 187 can prevents a disconnected portion from being generated in the insulating layer 140d while being integrally connected with the first dam portions 185. In the flexible display of the fifth exemplary embodiment, the remaining components other than the embossed pattern portion 187 are the same as those of the fourth exemplary embodiment.

Figure 11:
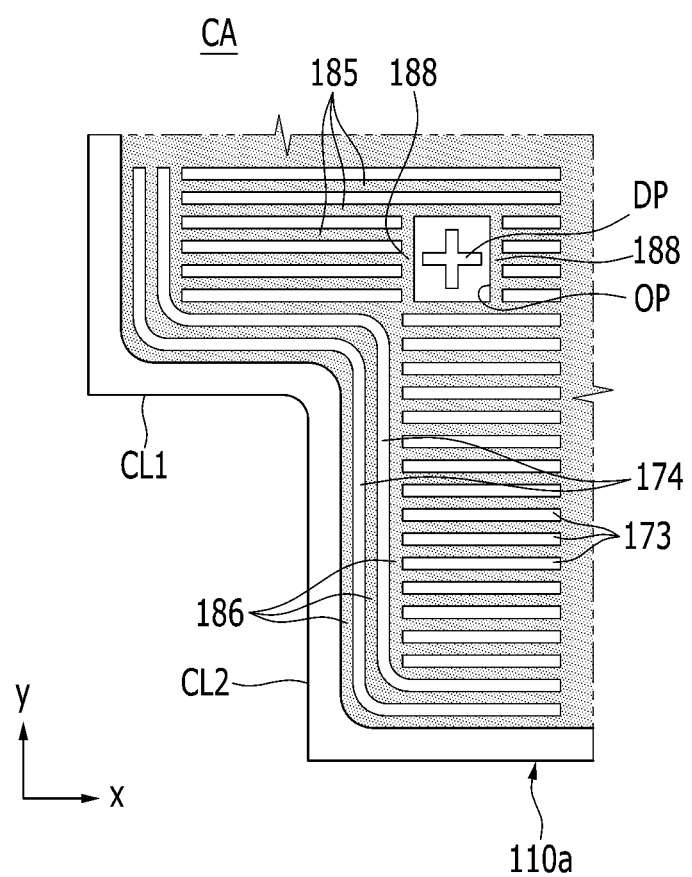
FIG. 11 is a plan view of a chamfer area of a flexible display according to a sixth exemplary embodiment.

FIG. 11 is a plan view of a chamfer area of a flexible display according to a sixth exemplary embodiment.

Referring to FIG. 11, an insulating layer 140e above the chamfer area CA forms an opening portion OP for forming the dummy pattern DP and includes third dam portions 188 surrounding the opening portion OP. The dummy pattern DP is formed on the surface of the flexible substrate 110a exposed by the opening portion OP.

Some of the third dam portions 188 abut the first dam portions 185 to prevent the first engraved pattern 173 from being opened toward the opening portion OP. Some of the remaining third dam portions 188 can belong to the first dam portion 185. That is, some of the first dam portions 185 can serve as the third dam portion 188. The insulating layer 140e including the third dam portion 188 does not include a disconnected portion to thereby prevent the generation of cracks.

Other components except for the opening portion OP and the third dam portion 188 in the flexible display of the sixth exemplary embodiment are the same as those of the fourth exemplary embodiment.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display, comprising:
   a flexible substrate including a display area, a pad area, and a plurality of chamfer areas formed at opposing ends of the pad area;
   an insulating layer formed over the flexible substrate; and
   a display unit formed over the flexible substrate in the display area,
   wherein each of the chamfer areas is adjacent to the display area in a first direction, and
   wherein the insulating layer formed in each of the chamfer areas includes a closed-engraved pattern having a stripe shape extending in a second direction that at least partially crosses the first direction.

2. The flexible display of claim 1, wherein each of the chamfer areas is bent in a second direction crossing the first direction.

3. The flexible display of claim 1, wherein:
   each of the chamfer areas includes a chamfer cut line, and
   each of the chamfer cut lines is formed as a straight line inclined with respect to at least one side of the flexible substrate.

4. The flexible display of claim 3, wherein the insulating layer formed in each of the chamfer areas comprises:
   a plurality of first barriers extending parallel to the second direction, and
   a second barrier contacting the first barriers and extending parallel to the chamfer cut line.

5. The flexible display of claim 4, wherein:
   the closed-engraved pattern is a first engraved pattern, and
   the second barrier includes a closed second engraved pattern having a stripe shape parallel to the chamfer cut line.

6. The flexible display of claim 5, wherein:
   the insulating layer formed in the chamfer area includes an embossed pattern contacting the first barriers, and
   a dummy pattern is formed on the embossed pattern.

7. The flexible display of claim 5, wherein the insulating layer formed in each of the chamfer areas comprises: i) an opening in which a dummy pattern is formed and ii) a third barrier contacting the first barriers and surrounding the opening.

8. The flexible display of claim 1, wherein:
   each of the chamfer areas includes a chamfer cut line, and
   each of the chamfer cut lines includes a first cut line parallel to at least one side of the flexible substrate and a second cut line crossing the first cut line.

9. The flexible display of claim 8, wherein the insulating layer formed in each of the chamfer areas comprises:
   a plurality of first barriers extending parallel to the second direction, and
   a second barrier contacting the first barriers, and
   at least a portion of the second barrier is formed parallel to an edge of the chamfer area including the chamfer cut line.

10. The flexible display of claim 9, wherein:
    the closed-engraved pattern is a first engraved pattern, and
    the second barrier includes a closed second engraved pattern elongated along the edge of the chamfer area.

11. The flexible display of claim 10, wherein the second engraved pattern comprises:
    a first linear portion parallel to the first cut line,
    a second linear portion parallel to the second cut line, and
    a curved portion connecting the first linear portion and the second linear portion.

12. The flexible display of claim 9, wherein:
the insulating layer formed in each of the chamfer areas includes an embossed pattern contacting the first barriers, and
a dummy pattern is formed on the embossed pattern.

13. The flexible display of claim 9, wherein the insulating layer formed in each of the chamfer areas comprises: i) an opening in which a dummy pattern is formed and ii) a third barrier contacting the first barriers and surrounding the opening.

14. The flexible display of claim 1, wherein:
the insulating layer includes at least one of a buffer layer, a gate insulating layer, and an interlayer insulating layer, and
the closed-engraved pattern is formed in at least one of the buffer layer, the gate insulating layer, and the interlayer insulating layer.

15. The flexible display of claim 1, wherein the display unit further comprises at least one organic light-emitting diode (OLED), and wherein the flexible display further comprises a driver formed on the flexible substrate in the pad area.

16. The flexible display of claim 1, further comprising a cover window covering the flexible substrate.

17. The flexible display of claim 16, wherein the cover window includes a curved portion covering the chamfer areas.

18. A flexible display, comprising:
a flexible substrate including a display area and a non-display area surrounding the display area, wherein the display area includes a plurality of pixels, wherein the non-display area includes: i) a pad area formed on one side of the display area and ii) a pair of chamfer areas formed on opposing sides of the pad area;
an insulating layer formed over the flexible substrate; and
a rigid cover window including a flat area and a pair of curved areas formed on opposing sides of the flat area,
wherein the flexible substrate is attached to the cover window such that the chamfer areas are respectively bent along the curved areas of the cover window, and
wherein the insulating layer formed in each of the chamfer areas is engraved to form a pattern having a stripe shape.

19. The flexible display of claim 18, wherein each of the chamfer areas is adjacent to the display area in a first direction and wherein the stripe shape of each of the patterns at least partially extends in a second direction crossing the first direction.

20. The flexible display of claim 18, wherein each of the chamfer areas includes a chamfer cut line, and each of the chamfer cut lines is formed as a straight line inclined with respect to at least one side of the flexible substrate.

* * * * *